Figure 1A:
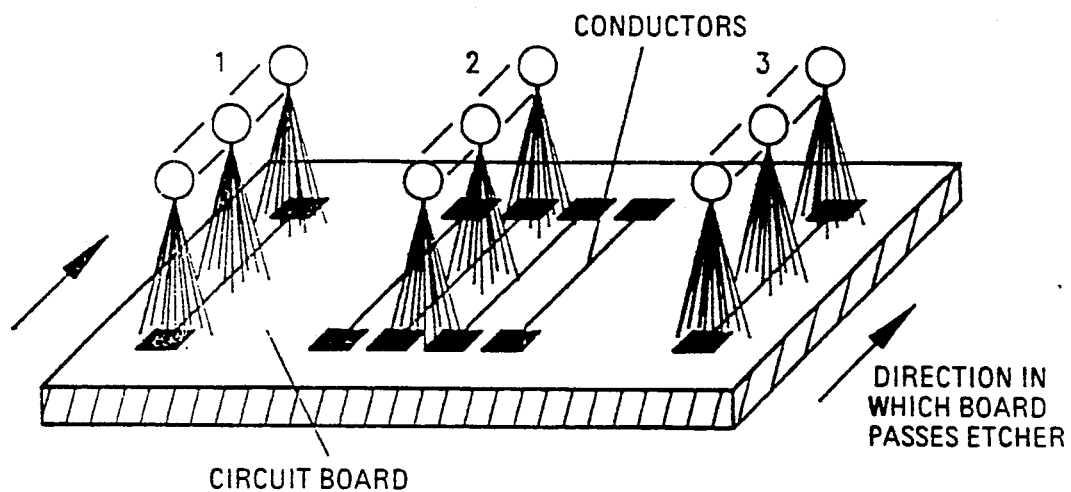

United States Patent [19]

Scheithauer et al.

[11] Patent Number: 5,071,508
[45] Date of Patent: Dec. 10, 1991

[54] METHOD OF AND ARRANGEMENT FOR ETCHING AN ETCH MATERIAL CONSISTING AT LEAST PARTLY OF METAL

[75] Inventors: Alfred Scheithauer, Stuttgart; Wolfgang Alberth, Kirchheim/Teck; Gert Pohl, Sindelfingen; Herbert Ziegler, Boeblingen, all of Fed. Rep. of Germany

[73] Assignee: International Business Machines Corporation, Armonk, N.Y.

[21] Appl. No.: 584,125

[22] Filed: Oct. 3, 1990

Related U.S. Application Data

[62] Division of Ser. No. 390,127, Aug. 7, 1989, Pat. No. 5,002,627.

[30] Foreign Application Priority Data

Dec. 8, 1988 [DE] Fed. Rep. of Germany ..... 88113109

[51] Int. Cl.$^5$ .......................... B44C 1/22; C23F 00/00
[52] U.S. Cl. ..................... 156/627; 156/640; 156/656; 156/659.1; 156/902
[58] Field of Search ............... 156/626, 627, 640, 656, 156/659.1, 661.1, 902, 345; 134/34, 198, 199

[56] References Cited

U.S. PATENT DOCUMENTS

| | | | |
|---|---|---|---|
| 3,401,068 | 9/1968 | Benton | 156/627 X |
| 3,788,912 | 1/1974 | Frantzen et al. | 156/640 |
| 3,808,067 | 4/1974 | Brown | 156/627 |
| 4,352,994 | 10/1982 | Inzoli et al. | 307/149 |
| 4,397,708 | 8/1983 | Frantzen | 156/640 X |
| 4,741,798 | 5/1988 | Haas | 156/626 |
| 4,772,365 | 9/1988 | Haas | 204/106 |

FOREIGN PATENT DOCUMENTS

| | | |
|---|---|---|
| 3345125 | 6/1985 | Fed. Rep. of Germany . |
| 3345206 | 6/1985 | Fed. Rep. of Germany . |
| 3539874 | 5/1987 | Fed. Rep. of Germany . |
| 3539886 | 5/1987 | Fed. Rep. of Germany . |
| 2482405 | 11/1981 | France . |
| 0076879 | 5/1984 | Japan . |
| 0093881 | 5/1984 | Japan . |

OTHER PUBLICATIONS

Adjustable Nozzles for Spray Etchers, Holemann et al., IBM Technical Disclosure Bulletin, vol. 13, No. 12, May 1971.

Primary Examiner—William A. Powell
Attorney, Agent, or Firm—Calfee, Halter & Griswold

[57] ABSTRACT

The invention concerns a method of etching an etch material consisting at least partly of metal and an arrangement for implementing that method.

According to the invention, the etchant is applied through jet assemblies arranged perpendicularly to each other on the top and the bottom side of the etch material. During the passage of the etch material, the spray pressure at the jet assemblies or the jets may be set to constant values and/or be individually controlled as a function of the quantity of metal to be etched off the top and the bottom side. The invention is particularly suitable for etching circuit boards, whose conductors on the top and the bottom side are arranged perpendicularly to each other.

9 Claims, 3 Drawing Sheets

CONTROL CIRCUIT (CLOSED LOOP)

METHOD OF AND ARRANGEMENT FOR ETCHING AN ETCH MATERIAL CONSISTING AT LEAST PARTLY OF METAL

This is a divisional of co-pending application Ser. No. 390.127 filed on Aug. 7, 1989, U.S. Pat. No. 5,002,627.

The invention concerns a method of etching an etch material consisting at least partly of metal, preferably copper, preferably of circuit boards, wherein the etchant is taken from the sump of an etcher and applied to the etch material by jet assemblies comprising a plurality of jets.

The invention also concerns an arrangement for implementing this method by means of an etcher comprising jet assemblies with a plurality of jets receiving etchant through fluid collector lines and individual fluid supply lines branching thereoff. The arrangement further comprises a device by which the spray pressure of the etchant at the jet assemblies or jets is individually adjusted as a function of the quantity of metal to be etched off the top or the bottom side of the etch material.

Methods of and arrangements for etching an etch material consisting partly of copper, preferably of circuit boards, are known from the German OS's DE-A-35 39 886 and DE-A-35 39 874. From DE-A-35 39 874 an arrangement is known wherein a device consisting of an optical reflection and thickness measuring means provides information on the quantity of metal to be etched off the respective etch material, and wherein a detector indicates when the etch material to be processed enters the etcher. The relevant electrical signals are processed in a central processing unit in the form of a signal which is fed to a dosing mechanism withdrawing a quantity of oxidizing agent and/or acid corresponding to this signal from the storage tank and adding it to the etchant the pump receives from the jets.

From the German OS's DE-A-33 45 206 and DE-A-33 45 125 arrangements are known for treating objects with a fluid, in particular etch and developing equipment for the production of circuit boards, wherein the quantity of the treating fluid flowing to the different jets contained in a jet assembly is individually measured and set. For this purpose, each jet is provided with an individual fluid supply line comprising a flowmeter series-connected to a regulating valve.

The arrangements described in the above-mentioned OS's are improved over those of the prior art in that the jets are no longer fitted to the fluid collector line direct, which prevents controlling or setting the fluid quantities fed to the individual jets, but that an individual fluid supply line leading to the fluid collector line is associated with each jet, and that each individual supply line comprises a flowmeter and a regulating valve. This permits optically or electrically controlling the fluid quantity flowing to each jet to determine changes in the flow of the etchant. The quantity of etchant leaving each jet or the spray pressure is individually adjusted, yielding spray characteristics suiting the specific etch material handled. However, neither OS provides details on how the spray pressure is to be adjusted or controlled in practice, in particular if the course of the conductors on the top side of the circuit boards differs from that on the bottom side or, more generally speaking, if the structures to be etched on the top side of the etch material differ from those on the bottom side.

It is the object of the present invention to provide a method of the previously described kind which permits both sides of the etch material to be uniformly etched independently of the density, height and course of the structures to be etched on either side. The method is to be suitable in particular for etching circuit boards wherein the conductors on the top side extend in another direction than those on the bottom side, for example, perpendicularly to each other.

This object according to the invention is accomplished by a method of the previously described kind which is characterized in that the etchant is applied by jet assemblies comprising jets and which are arranged perpendicularly to each other on the top and the bottom side of the etch material, and that as the etch material passes through the etcher, the spray pressures of the etchant at the jet assemblies or jets are set to constant values and/or are individually adjusted by means (20) as a function of the quantity of metal to be etched off the top and the bottom side of the etch material.

This ensures a constant etch rate on the top and the bottom side of the etch material, which is independent of the density and height and the course of the structures to be etched.

Another object of the invention is to design an arrangement of the above-described kind such that the etch material with the desired structures may be reliably etched.

This object is accomplished according to the invention by an arrangement comprising jet assemblies arranged perpendicularly to each other above and below the etch material, and measuring and regulating devices for individually adjusting the fluid quantities applied to or the spray pressures of the jet assemblies or the individual jets.

Figure 1B:
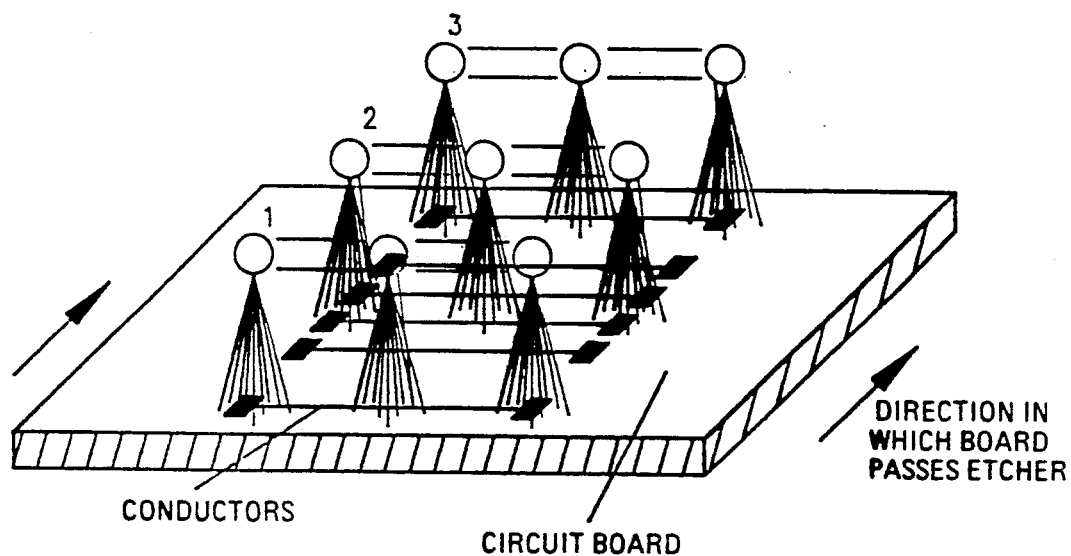
Figure 2:
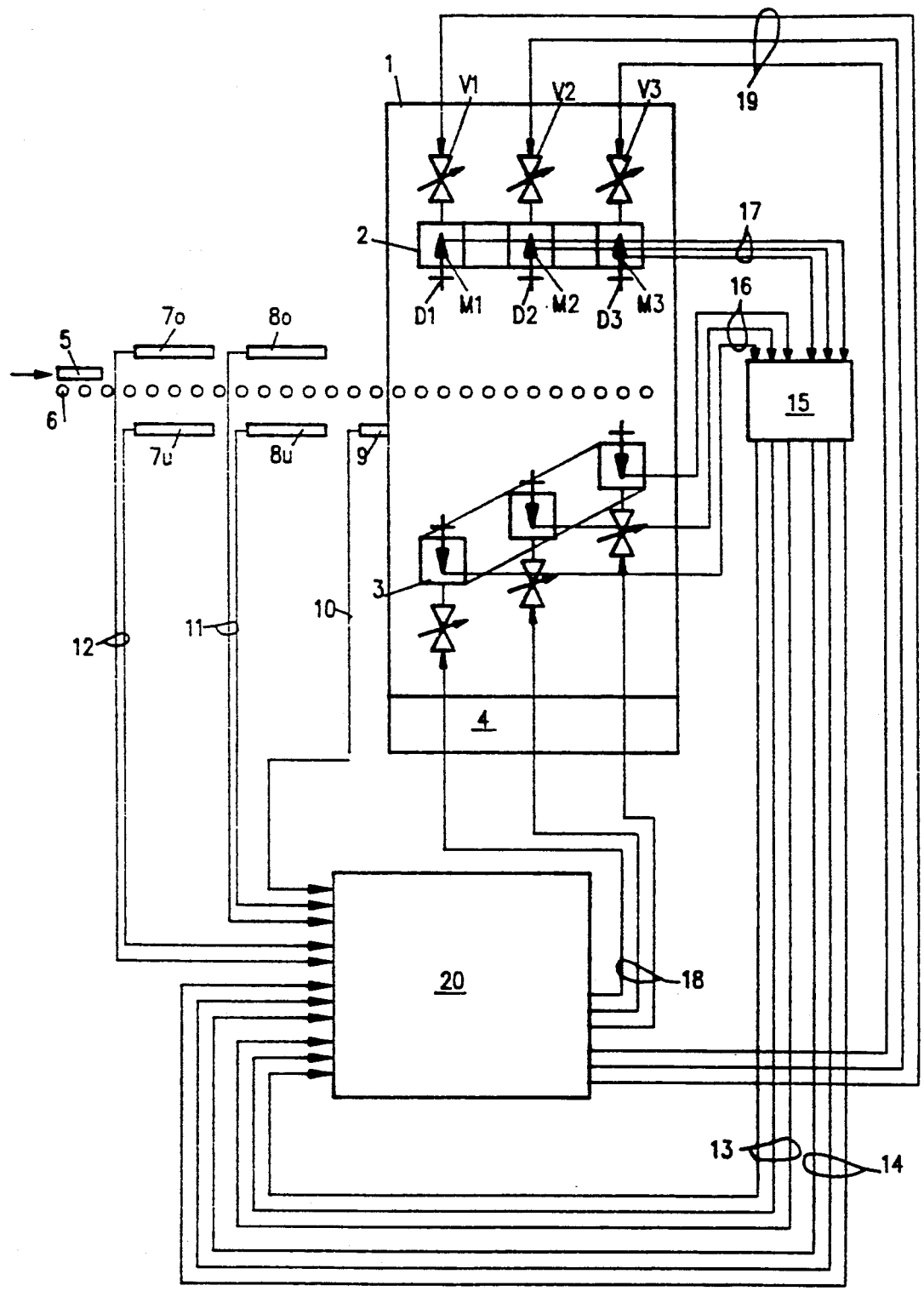
Figure 3:
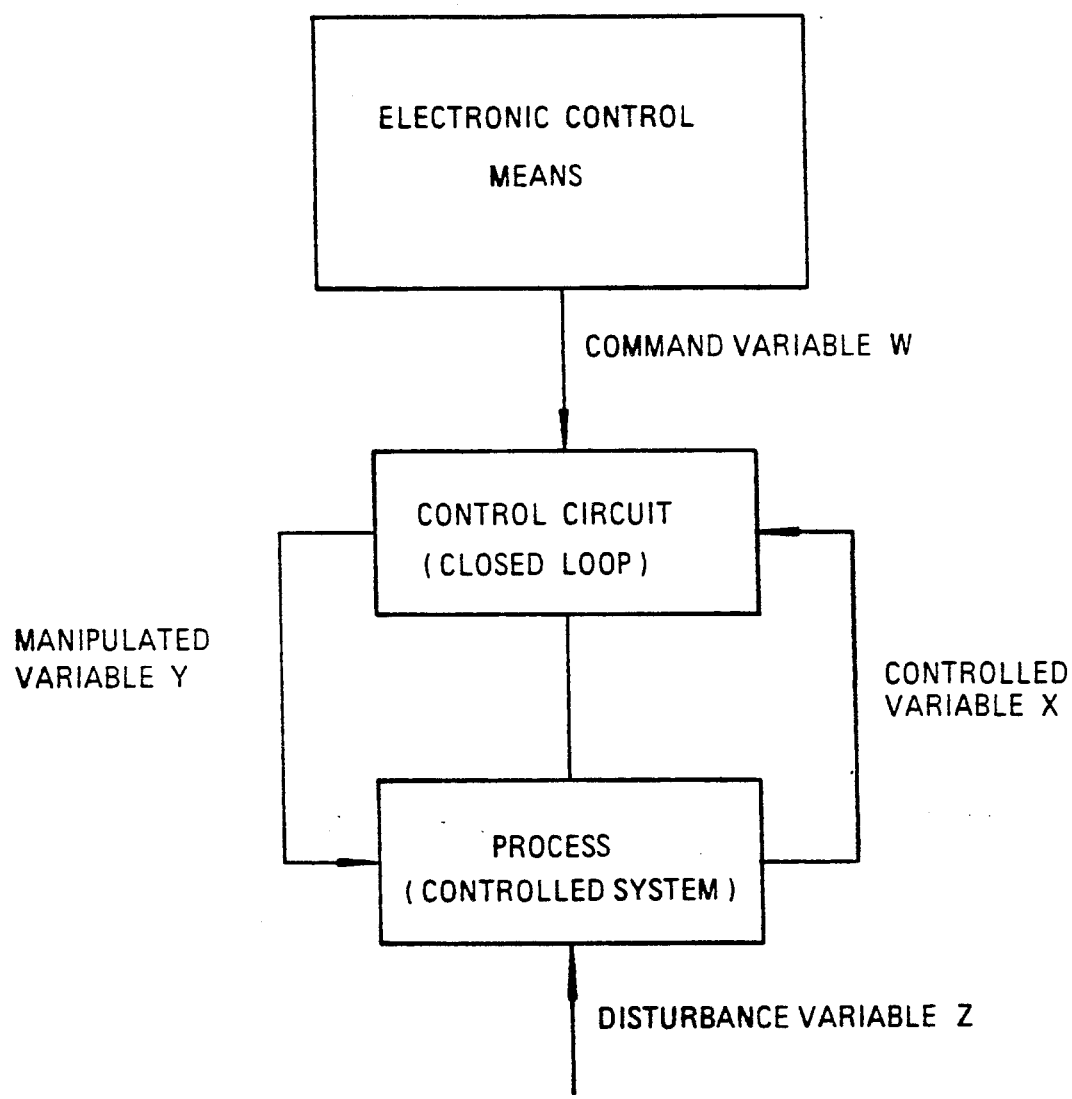

The invention is described in detail below with reference to FIGS. 1A, 1B, 2 and 3, in which FIG. 1A shows a circuit board introduced into the etcher in the direction of the conductor pattern (prior art), FIG. 1B shows a circuit board introduced into the etcher perpendicularly to the direction of the conductor pattern, FIG. 2 shows an arrangement for implementing the method according to the invention, comprising a monitoring and control unit, and FIG. 3 shows a closed loop control system for the arrangement of FIG. 2.

FIG. 1A shows a circuit board processed by subtractive etching. This etch method provides for the desired conductor pattern to be applied in the form of an alkali- or solvent-soluble resist to be copper-plated laminate, the conductors of FIG. 1A being coated with resist (not shown), and the copper on the surface of the circuit board not coated with resist being etched off when the circuit board passes through the etcher. In addition to regions with dense conductor patterns, circuit boards comprise as a rule single conductors. It is known that owing to missing edge protection, resist patterns covering individual conductors are laterally undercut more strongly than resist patterns covering conductors in a dense pattern, with the consequence that single conductors on the outside of FIG. 1A have a smaller width than the conductors of the dense pattern in the center of the circuit board.

In order to obtain substantially uniform conductor widths during etch independently of the position of the conductors, it is suggested that the spray pressure at the jets be reduced for a specific product range. Thus, for instance, by reducing the spray pressure in the two outer jet assemblies 1 and 3 of FIG. 1A by about 30%, a substantially uniform width of the individual conductors and the dense conductor pattern on the circuit board is obtained. For setting the spray pressure to particular values for specific product ranges it is essential that the conductor patterns are arranged parallel to the jet assemblies and the jets contained therein, and that the circuit boards are fed through the etcher in the direction of the conductors. The setting of the spray pressure at the individual jet assemblies is fixed. An advantage of this method is that, provided the conductors are suitably arranged, elaborate process control means may be dispensed with.

However, as a result of technical progress, the conductors on the top and the bottom side of presently processed circuit boards are arranged perpendicularly to each other. This means that only on the side of the board on which the conductors are arranged parallel to the jet assemblies and if the board is fed through the etcher in that direction improved etch characteristics are obtainable by suitably setting the spray pressure. On the other side of the board where the conductors are arranged perpendicularly to the direction in which the board passes the etcher (FIG. 1B), the etch characteristics cannot be improved by a fixed setting of the spray pressure for the individual jet assemblies or jets.

Improved etch characteristics of conductors that are arranged perpendicularly to the direction in which the etcher is passed may be obtained if during the board's passage through the etcher the spray pressure of the individual jet assemblies or the individual jets is continuously adjusted as a function of the conductor density. If, for example, according to FIG. 1B, a circuit board is introduced into the etcher perpendicularly to the direction of the conductor pattern, the spray pressure of jet assembly 1 or of the individual jets contained therein is reduced by the control electronics when a single conductor is positioned below them. If the transfer of the component continues, the spray pressure of jet assembly 1, below which a dense conductor pattern is positioned at this stage, is increased to suit the conductor density, while the spray pressure of jet assembly 2, below which a single conductor is positioned, is reduced by the control electronics, etc.

The method according to the invention and the arrangement for its implementation afford a plurality of ways in which the etch material may be processed. Thus, for example, the spray pressures of the jet assemblies on the top and the bottom side may be set to constant values and/or be variably controlled during the passage of the etch material Particularly advantageous etch characteristics are obtained if in lieu of a single etch chamber two tandem-connected etch chambers are used, with the spray pressures of the jet assemblies on the top side in the first chamber being set to constant values and the spray pressures of the jet assemblies on the bottom side, which are arranged perpendicularly to those on the top side, being continuously controlled as a function of the structures to be etched. In the second etch chamber the jet assemblies on the top and the bottom side of the etch material are arranged perpendicularly to those in the first chamber, with the spray pressure of the jet assemblies on the top side being continuously controlled and those of the jet assemblies on the bottom side being set to constant values. This kind of control, which is described in detail further on by means of an example, yields noticeably improved etch characteristics at the individual points of the etch material. The individual jet assemblies may be individually controlled. As all jets have individual liquid supply lines with a liquid flowmeter and a regulating valve, the spray pressures of the jet assemblies and the individual jets may be differently controlled by the control electronics not only at the jet assemblies but also at the individual jets of each assembly, leading to a further improvement of the etch characteristics.

An arrangement for implementing the method according to the invention is described below with reference to FIGS. 2 and 3. In the arrangement according to the invention the adjustments required for adapting the spray pressure to the quantity of metal to be removed are performed largely automatically, so that operator errors are avoided. A code for the etch material to be processed or the quantity of metal to be etched off may also be keyed by hand into the central control electronics direct. The latter approach is of particular advantage in cases where large batches of identical components, such as circuit boards, are to be processed. The speed at which the etch material to be processed is to be led through the etcher is in each case entered by hand into the central control electronics.

Of the jet assemblies 2 and 3 in etch chamber 1 of the etcher of FIG. 2 only jets D1 to D3 having spray openings pointing downwards and upwards, respectively, are shown. Depending upon the dimensions of the components to be etched, each jet assembly is, of course, provided with a much larger number of jets which are arranged in a regular fashion but which have been omitted from the drawing for clarity. This applies by analogy to the flowmeters M1 to M3 and the regulating valves V1 to V3. The pumps, lines and storage tanks for the etchant, acid and oxidizing agents have also been omitted for clarity. Details on these are described in the prior art. FIG. 2 illustrates essentially the regulation and control of the spray pressure of the etchant at the jets as a function of the quantity of metal to be etched off the etch material.

The illustrated etcher comprises an input section in which the etch material 5, say, a circuit board, is placed on a roller conveyor 6. Roller conveyor 6 conveys the etch material from left to right through the etcher. For determining the quantity of metal to be etched off the etch material 5 to be processed, devices 7 o, u and 8 o, u are provided. Device 7 o, u is a known optical reflection measuring device by which the bared metal surface on the top and the bottom side of the etch material 5 is derived from the reflection of light. Device 8 o, u is a thickness measuring device which is also known and which determines the thickness of the metal layer to be removed from the top and the bottom surface of the etch material 5. The entry of the etch material 5 into the etch chamber 1 is monitored by a detector 9. Detector 9 may take the form of a reflection light barrier or a microswitch.

In the etch chamber 1, an upper jet assembly 2, comprising a plurality of jets D1 to D3, and a lower jet assembly 3, also comprising a plurality of jets, are arranged. Jet assemblies 2 and 3 are arranged perpendicularly to each other. The etch material transported on roller conveyor 6 is sprayed by jet assemblies 2 and 3 from the top and the bottom with a liquid etchant containing acid or an alkaline solution and oxidizing agents. The lower portion of the etch chamber 1 comprises an etchant sump 4. As previously mentioned, the withdrawal line, the pumps, the supply lines for the jet assemblies and the storage tanks are not shown in the drawing.

Central control electronics 20 is connected through electrical lines 12, 11, 10 to the optical reflection measuring device 7 o, u, the thickness measuring device 8 (o, u) and the detector 9, receiving therefrom electrical signals corresponding to the respective measuring values. Through a line, the central control electronics 20 may also be connected to a keyboard (not shown) acting as an input unit. The central control electronics 20 is connected to measuring electronics 15 through electrical lines 13 and 14. The measuring electronics 15 in turn is connected through electrical lines 17, 16 to flowmeters M1, M2, M3 which are associated with each individual jet D1, D2, D3 of the upper jet assembly 2 and the lower jet assembly 3. The flowmeters may take the form of, say, lifting force measuring means or of turbines running with the flowing etchant or of sensors permitting ultrasonic measurement, or of hydrodynamic pressure indicators and the like. Each flowmeter is associated with an electrical transducer having its own measuring electronics. Alternatively, the various transducers may be sequentially and cyclically connected to a single electronic measuring device by a multiplexer controlled by a clock generator, and the output signal of the electronic measuring device may be fed to a display unit by a demultiplexer sequentially and cyclically controlled by the clock generator. Each jet may also be provided with a comparator circuit determining the lower permissible boundary values for the quantity of etchant flowing through each jet. If the measured value is below a boundary value, a comparator generates an auxiliary function which is fed to the display. Further details on flowmeters, their design and function may be seen from the German OS DE-A-33 45 125.

By means of the flowmeters, the quantity of the etchant fed to each jet or the respective spray pressure may be individually measured, and the measuring electronics 15 transfers electrical signals, corresponding to the measured values of the quantities of etchant or the pressures applied to the jets, to the central control electronics 20. Through electrical lines 18, 19, the control electronics 20 is linked with the regulating valves V1, V2, V3 which are series-connected to the flowmeters in each jet supply line. By means of the output signals emitted by the control electronics 20, the regulating valves are actuated, and the quantity of etchant and the spray pressure applied to each jet are individually controlled.

The described etch system operates as follows.

It is the aim to adjust the spray pressure of the etchant at the individual jet assemblies or the individual jets for each etch process to the quantity of metal to be etched off the etch material 5.

For this purpose, the central control electronics 20 receives from devices 7 o, u and 8 o, u through lines 12, 11, first signals, i.e., data on the area and thickness of the metal film to be removed. From this data the control electronics determines the quantity of metal to be removed from the etch material 5 as it passes the devices 7 o, u and 8 o, u for subsequent etching in the etcher. According to a stored program, the control electronics 20, for example, associates the determined quantity of metal to be removed with the respective spray pressures (desired values) on the individual jet assemblies 2, 3 or the jets above and below the etch material, unless they are to be set constant values for the spray pressure.

When a second signal indicating the entry of the etch material 5 into the etch chamber 1 is applied by detector 9 to the central control electronics 20 through line 10, the control electronics 20 produces fourth signals which are representative of the desired values of the spray pressures of the jets.

Through lines 14, 13, the control electronics 20 also receives third measuring signals from the measuring electronics 15, which are representative of the actual values of the flow or pressures at the individual jets. The control electronics compares these third signals with the fourth signals representative of the desired pressure values. The resulting fifth signals are fed through electrical lines 19, 18 to the regulating valves V1, V2, V3 of the individual jets D1, D2, D3 in the jet assemblies 2, 3 above and below the etch material for actuating them or for setting the computed and the corrected spray pressures.

To illustrate the process control, attention is drawn to FIG. 3. The control electronics 20 computes from the signals 1 (reflection 7 o, u and thickness 8 o, u) and signal 2 (entry of etch material) the desired value of the spray pressure on the jets. The desired value is designated as command variable W in FIG. 3 and corresponds to signal 4. The measuring electronics 15 applies to the closed loop control circuit signals 3 corresponding to the actual value of the flows or spray pressures at the individual jets. The actual value in FIG. 3 comprises the disturbance variable Z and the controlled variable X. A comparison of these variables with the command variable W (signals 3 and 4) yields the manipulated variable Y of the closed loop control circuit. The manipulated variable Y is used to control the spray pressure on the jets during the etch process.

The arrangement of the invention is particularly suitable for etching circuit boards whose conductor patterns on the top and the bottom surface extend perpendicularly to each other. According to a first example, 7 jet assemblies which are arranged parallel to the direction of the conductors on the circuit board are provided in the etch chamber on the bottom side of the etch material. As the circuit board of this example is introduced into the etcher in the direction of the conductors on its bottom side, the spray pressure of the individual jet assemblies or jets on the bottom side is adjusted to particular fixed values depending upon the conductor density to be etched, with optimum values being predetermined by experiment. On the top side of the etch material, this example provides for 5 jet assemblies to be arranged parallel to the direction of the conductors. As the conductor pattern on the top side of the board extends perpendicularly to the conductor pattern on the bottom side and therefore also perpendicularly to the direction in which the board passes the etcher, the spray pressure at the jet assemblies and the individual jets, respectively, has to be continuously controlled as a function of the conductor density. Details of this control have been described above.

As previously mentioned, it is particularly advantageous for the first etch chamber to be followed by a second etch chamber. In the second etch chamber the jet assemblies on the top side extend perpendicularly to those in the first etch chamber. This applies by analogy to the course of the jet assemblies in the two etch chambers on the bottom side. In the second etch chamber, the spray pressure on the top side is set to constant values at the individual jet assemblies or jets, whereas at the jet assemblies or jets on the bottom side it is continuously controlled as described above.

If for space reasons only one etch chamber may be provided, this etch chamber may be fitted on the top and the bottom side with two perpendicularly arranged jet assembly systems each. When the etch chamber is passed for the first time, the first two perpendicularly arranged jet assembly systems are used on the top and the bottom side, whereas when it is passed a second time, the second two jet assembly systems arranged perpendicularly to each other and to the first two systems are used. It is also possible to equip the etch chamber with only one jet assembly system, wherein the jets are arranged perpendicularly to each other, and to provide means at the jet assemblies, by which the direction of spray may be changed when the etch material passes the etch chamber a second time.

According to a second example, not shown in the drawing, the etch material takes the form of plates on which, for example, copper has been deposited with different thicknesses in individual areas. Different layer thicknesses may be obtained by electroless or electrodepositing of copper if the apparatus used is defective or defects occur during the deposition process. In this example, too, it is advantageous to use an etch system with two tandem-connected etch chambers which are designed in the above-described manner. When the etch material passes the first chamber, the spray pressure of the etchant at the jet assemblies or jets at the top, for example, may be continuously controlled, depending upon the respective height of the copper layer to be etched off, whereas on the bottom side at the jet assemblies positioned perpendicularly to those on the top side it may be set to constant values. In the second etch chamber, the jet assemblies on the top and the bottom side extend perpendicularly to those in the first chamber. The spray pressures at the jet assemblies or jets are differently controlled, according to the different arrangement of the assemblies or jets, i.e., at the top there are constant values, whereas at the bottom control is effected continuously as a function of the thickness of the layer to be removed.

The process control is not limited to the previously described rigid pattern but may be adapted in a multitude of ways in the etch chamber or individual etch chambers and at individual jet assemblies or jets to suit the respective etch material to be processed.

We claim:

1. A method of etching a material having a first surface and a second surface, each of which surfaces comprises a metal coated substrate masked to shield from etchant solutions a desired conductor pattern, the method comprising the steps of:
   supporting the material,
   passing the supported material through at least one etch chamber having a plurality of jet assemblies, wherein each jet assembly is comprises of a plurality of jets for delivering etchant at a given flow rate or spray pressure to the surfaces of the material;
   arranging said jet assemblies substantially perpendicular to the first and second support surfaces such that at least one jet assembly delivers etchant to the first surface of the material and at least one jet assembly delivers etchant to the second surface of the material;
   determining the quantity of metal to be etched off, and generating and emitting a first signal corresponding thereto;
   transmitting said first signal to a central controlling means;
   generating and emitting a second signal when the material to be etched enters the chamber;
   transmitting said second signal to said central controlling means;
   measuring the etchant flow rate or spray pressure of the etchant delivered through the individual jets;
   generating and emitting a third signal corresponding thereto;
   transmitting said third signal to said central controlling means;
   calculating from the first signal the desired etchant flow rate or spray pressure values;
   generating a fourth signal when said second signal is received; and
   comparing the third signal and the fourth signal, and generating and transmitting to regulating valve means at said jets a fifth signal representative of the compared signal differences for adjusting the flow rate or spray pressure of the etchant solutions existing the spray openings.

2. The method recited in claim 1, wherein the steps of passing the material through at least one etch chamber comprises passing the material through at least one etch chamber substantially perpendicular to the jet assemblies;
   arranging a conductor pattern substantially parallel to each of said jet assemblies and substantially perpendicular to the direction in which the material passes through at least one etch chamber; and
   setting the etchant flow rate or spray pressure in each of said jet assemblies to a constant value during the passage of the material through at least one etch chamber, said constant value corresponding to the conductor pattern density of the material.

3. The method recited in claim 1, wherein the steps of passing the material through at least one etch chamber comprises passing the material through at least one etch chamber substantially parallel to the jet assemblies;
   arranging a conductor pattern substantially parallel to each of said jet assemblies and substantially parallel to the direction in which the material passes through at least one etch chamber; and
   setting the etchant flow rate or spray pressure in each of said jet assemblies to a constant value during the passage of the material through at least one etch chamber, said constant value corresponding to the conductor pattern density of the material.

4. The method recited in claim 1, wherein the step of passing the material through at least one etch chamber is performed at a fixed rate.

5. The method recited in claim 1, including the additional steps of determining the optical reflection of the metal to be etched;
   measuring the thickness of the metal layer to be removed;
   relating the reflection to the thickness of the metal layer to be removed; and
   emitting said first signal corresponding thereto.

6. The method recited in claim 1, wherein the step of delivering etchant solution to the surfaces of the material comprises delivering an etchant solution selected from the group consisting of (1) an acid solution and an oxidizing agent, and (2) an alkaline solution and an oxidizing agent.

7. The method recited in claim 1, wherein the step of measuring the etchant flow rate or spray pressure comprises measuring the etchant flow rate or spray pressure with a plurality of flow meters with electrical transducers connected to a measuring electronic means, said measuring electronics means adapted to generate from a signal of each transducer, said third signal representative of the actual flow rate at a jet and transmit said third signal to the control means.

8. The method recited in claim 1, wherein the step of delivering etchant at a given flow rate or spray pressure comprises arranging at least two jet assemblies substantially perpendicular to each other and direction etchant to the first surface of the material; and arranging at least two jet assemblies substantially perpendicular to each other and directing etchant to the second surface of the material.

9. The method recited in claim 1, wherein the step of passing the supported material comprises passing the material through a first and second etch chamber wherein each of said etch chambers has at least one jet assembly directed to the first surface of the material and at least one jet assembly directed to the second surface of the material;

arranging at least one jet assembly directed to the first surface substantially perpendicular to at least one jet assembly directed to the second surface;

arranging the jet assemblies in the first etch chamber directed to the first surface substantially perpendicular to the jet assemblies in the second etch chamber directed to the first surface, and arranging the jet assemblies in the first etch chamber directed to the second surface substantially perpendicular to the jet assemblies in the second etch chamber directed to the second surface;

setting the value of the etchant flow rate or spray pressure in a jet in the second chamber to a constant value during the passage of the material; and controlling the value of the etchant flow rate or spray pressure in a jet in the first etch chamber as a function of the thickness of the metal to be etched.

* * * * *